US009673367B2

(12) United States Patent
Ahn et al.

(10) Patent No.: US 9,673,367 B2
(45) Date of Patent: Jun. 6, 2017

(54) SUBSTRATE FOR MOUNTING CHIP AND CHIP PACKAGE

(71) Applicant: Point Engineering Co., Ltd., Asan-si (KR)

(72) Inventors: Bum Mo Ahn, Suwon-si (KR); Tae Hwan Song, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 15/022,557

(22) PCT Filed: Sep. 17, 2014

(86) PCT No.: PCT/KR2014/008641
§ 371 (c)(1),
(2) Date: Mar. 16, 2016

(87) PCT Pub. No.: WO2015/041456
PCT Pub. Date: Mar. 26, 2015

(65) Prior Publication Data
US 2016/0211428 A1    Jul. 21, 2016

(30) Foreign Application Priority Data
Sep. 17, 2013   (KR) .................. 10-2013-0111578

(51) Int. Cl.
*H01L 33/00*   (2010.01)
*H01L 33/48*   (2010.01)
(Continued)

(52) U.S. Cl.
CPC ............ *H01L 33/62* (2013.01); *H01L 23/544* (2013.01); *H01L 24/08* (2013.01); *H01L 33/486* (2013.01);
(Continued)

(58) Field of Classification Search
CPC ....... H01L 23/00; H01L 23/544; H01L 33/00; H01L 33/48; H01L 33/54; H01L 33/62;
(Continued)

(56) References Cited

U.S. PATENT DOCUMENTS

| 2005/0242362 A1* | 11/2005 | Shimizu | ................... F21L 4/00 |
|---|---|---|---|
| | | | 257/99 |
| 2009/0206358 A1* | 8/2009 | Chen | ................... H01L 31/0203 |
| | | | 257/99 |
| 2016/0247781 A1* | 8/2016 | Sung | ....................... H01L 23/13 |

FOREIGN PATENT DOCUMENTS

| JP | 2003-303999 A | 10/2003 |
|---|---|---|
| JP | 2004-119981 | 4/2004 |

(Continued)

OTHER PUBLICATIONS

International Searching Authority, International Search Report—International Application No. PCT/KR2014/008641, dated Dec. 23, 2014, 2 pages.

*Primary Examiner* — Chuong A Luu
(74) *Attorney, Agent, or Firm* — Sunstein Kann Murphy & Timbers LLP

(57) ABSTRACT

A chip mounting substrate including a plurality of conductive portions to apply an electrode voltage to a mounted chip having electrode portions, at least one insulation portion configured to electrically isolate conductive portions, a cavity depressed inward of the conductive portions and providing a space in which the chip is mounted and bumps formed on surfaces of the conductive portions having the cavity and bonded to the electrode portions. In the case of a metal substrate, a tight bonding is enabled between the chip and the substrate by bonding a plating layer formed on the electrode portions of the chip using bumps formed on the metal substrate.

10 Claims, 4 Drawing Sheets

(51) Int. Cl.
   *H01L 33/62*     (2010.01)
   *H01L 23/544*    (2006.01)
   *H01L 23/00*     (2006.01)
   *H01L 33/54*     (2010.01)
   *H01L 33/64*     (2010.01)

(52) U.S. Cl.
   CPC .............. *H01L 33/54* (2013.01); *H01L 24/11* (2013.01); *H01L 24/13* (2013.01); *H01L 24/16* (2013.01); *H01L 24/81* (2013.01); *H01L 24/83* (2013.01); *H01L 33/647* (2013.01); *H01L 2223/54426* (2013.01); *H01L 2223/54486* (2013.01); *H01L 2224/08238* (2013.01); *H01L 2224/1134* (2013.01); *H01L 2224/131* (2013.01); *H01L 2224/13082* (2013.01); *H01L 2224/13144* (2013.01); *H01L 2224/16145* (2013.01); *H01L 2224/16225* (2013.01); *H01L 2224/16227* (2013.01); *H01L 2224/16245* (2013.01); *H01L 2224/48091* (2013.01); *H01L 2224/48227* (2013.01); *H01L 2224/73204* (2013.01); *H01L 2224/81191* (2013.01); *H01L 2224/81192* (2013.01); *H01L 2224/81207* (2013.01); *H01L 2224/81424* (2013.01); *H01L 2224/81801* (2013.01); *H01L 2224/83104* (2013.01); *H01L 2224/92125* (2013.01); *H01L 2924/00015* (2013.01); *H01L 2924/12041* (2013.01); *H01L 2924/15153* (2013.01); *H01L 2924/15156* (2013.01); *H01L 2924/19107* (2013.01); *H01L 2933/0033* (2013.01)

(58) Field of Classification Search
   CPC ..... H01L 33/486; H01L 33/647; H01L 24/08; H01L 24/11; H01L 24/13; H01L 24/16; H01L 24/81; H01L 24/83; H01L 2223/54426; H01L 2223/54486; H01L 2224/08238; H01L 2224/1134; H01L 2224/131; H01L 2224/13144; H01L 2224/16145; H01L 2924/12041; H01L 2924/00015; H01L 2924/15153; H01L 2924/15156; H01L 2924/19107
   USPC ........................................................ 257/737
   See application file for complete search history.

(56) References Cited

FOREIGN PATENT DOCUMENTS

| | | |
|---|---|---|
| JP | 2008-172113 | 7/2008 |
| KR | 10-0650263 | 11/2006 |

* cited by examiner

SUBSTRATE FOR MOUNTING CHIP AND CHIP PACKAGE

This application is the national phase entry of international patent application no. PCT/KR2014/008641 filed Sep. 17, 2014 and claims the benefit of Korean patent application No. 10-2013-0111578, filed Sep. 17, 2013, the disclosures of which are incorporated herein by reference in their entirety.

TECHNICAL FIELD

The present invention relates to a substrate for mounting a chip and, more particularly, to a substrate on which an ultraviolet chip is to be mounted and a package on which an ultraviolet chip is mounted.

BACKGROUND ART

In most cases, an ultraviolet chip has the form of a flip chip in which an electrode is formed in a lower portion thereof. In order to mount a chip having a flip chip structure on a substrate, a sub-mount is used in view of the position of an electrode and the flatness of a substrate.

Specifically, in a ceramic package of related art, a sub-mount of the type in which an electrode is coated on a silicon wafer mounted with a chip is bonded to an electrode portion formed on a ceramic substrate. The electrode formed on the silicon wafer is bonded to an electrode of an ultraviolet flip chip, thereby mounting the chip.

According to this method, it is necessary to perform an additional step of mounting the sub-mount on the ceramic substrate. Due to the structural feature (epoxy adhesive agent) for mounting the sub-mount, there is posed a problem in that the heat generated in the ultraviolet chip cannot be effectively transferred to a metal substrate, as a result of which the lifespan of the ultraviolet-curable adhesive agent is reduced.

SUMMARY OF THE INVENTION

Technical Problems

In view of the aforementioned problem, it is an object of the present invention to provide a metal substrate structure capable of mounting a chip without having to use a sub-mount. Another object of the present invention is to provide a chip package structure capable of preventing exposure of a bonding portion formed by the mounting of a chip.

Solution to Problem

According to one aspect of the present invention for achieving the above objects, there is provided a chip mounting substrate, including: a plurality of conductive portions configured to apply an electrode voltage to a mounted chip having electrode portions; at least one insulation portion configured to electrically isolate the conductive portions in order to apply an electrode voltage to the electrode portions of the chip; and a plurality of bumps formed at a predetermined height on surfaces of the conductive portions and bonded to the electrode portions of the chip.

In the chip mounting substrate, a cavity depressed inward of the conductive portions and configured to provide a space in which the chip is mounted may preferably be formed in the conductive portions, the chip mounted within the cavity.

In the chip mounting substrate, the bumps may preferably be formed at a predetermined height on the surfaces of the conductive portions having the cavity and may preferably be bonded to the electrode portions of the chip.

In the chip mounting substrate, the electrode portions of the chip may preferably be formed on one surface of the chip facing the surfaces of the conductive portions having the cavity, and the bumps may preferably be bonded to the electrode portions formed on one surface of the chip facing the surfaces of the conductive portions having the cavity.

The chip mounting substrate may further include: solders formed on surfaces of the bumps to solder the bumps to the electrode portions of the chip.

The chip mounting substrate may further include: marking portions formed on the surfaces of the conductive portions across the insulation portion to indicate positions where the bumps are formed.

In the chip mounting substrate, a recess having a predetermined depth may preferably be formed within the cavity, and the bumps may preferably be formed at a predetermined height on the surfaces of the conductive portions within the recess and are bonded to the electrode portions of the chip.

The chip mounting substrate may further include: plating layers formed at a predetermined height on the surfaces of the conductive portions isolated by the insulation portion and configured to bond the conductive portions to the bumps.

According to another aspect of the present invention for achieving the above objects, there is provided a chip package, including: a chip; and a chip mounting substrate including a plurality of conductive portions configured to apply an electrode voltage to the chip having electrode portions, at least one insulation portion configured to electrically isolate the conductive portions in order to apply an electrode voltage to the electrode portions of the chip, and a plurality of bumps formed at a predetermined height on surfaces of the conductive portions and bonded to the electrode portions of the chip.

The chip package may further include: an encapsulation portion formed in a space between the chip and the chip mounting substrate, which is formed by bonding the bumps to the electrode portions of the chip, wherein the encapsulation portion may be configured to encapsulate a bonding region of the chip.

Advantageous Effects of Invention

According to the present invention, in the case of a metal substrate including a vertical insulating layer, the electrode portions of the chip and the electrode portions of the substrate need to be electrically connected to each other. Thud, by additionally forming the bumps on the metal substrate and bonding the bumps to the electrode portions of the chip, it is possible to provide reliable bonding between the substrate and the chip.

Furthermore, by coating the encapsulation material on the bonding region of the chip, it is possible to prevent generation of a crack which may otherwise be generated due to a difference in thermal expansion coefficient between the materials. It is also possible to prevent oxidation of the bonding region which may otherwise be caused by an ambient air. This makes it possible to perform a packaging process without having to use an additional process of filling an inert gas into a space in which the chip is mounted.

DESCRIPTION OF EMBODIMENTS

The following disclosure merely illustrates the principle of the invention. While not explicitly described or illustrated in the subject specification, it may be possible for a person skilled in the art to invent different devices which realize the principle of the invention and which fall within the spirit and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, a chip mounting substrate will be described in detail with reference to the accompanying drawings. For the sake of convenience, descriptions will be made by taking an ultraviolet chip as an example of a chip.

Figure 1:
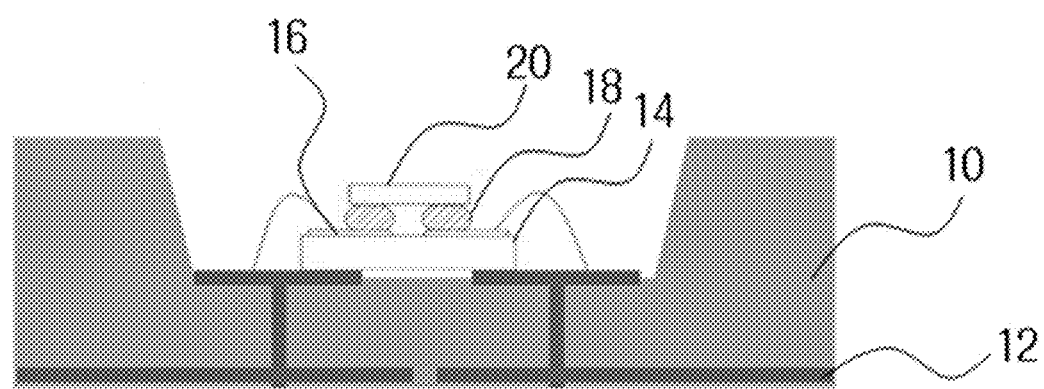
FIG. 1 is a view illustrating a ceramic package in which a chip is mounted on a ceramic substrate for holding an ultraviolet flip chip.

FIG. 1 is a view illustrating a ceramic package in which a chip is mounted on a ceramic substrate 10 for holding an ultraviolet flip chip 20.

The ceramic substrate 10 includes electrode portions 12 formed therein and configured to apply an electrode voltage to the chip 20 mounted thereon. The chip is connected to the electrode portions 12 by wire bonding.

Owing to the features of a ceramic structure that does not require an insulation layer, the electrode portions 12 are electrically isolated from each other. In view of the structural features of the ultraviolet flip chip 20 having the electrode portions formed in the lower portion thereof and in view of the flatness of the substrate, the chip 20 is not directly mounted to the substrate but is mounted using a sub-mount 14.

Specifically, in the ceramic package, the sub-mount 14 formed by coating an electrode on a silicon wafer is bonded to the electrode portions 12 formed in the ceramic substrate. Electrode portions 16 formed on the silicon wafer and electrodes of the ultraviolet flip chip are bonded to each other, thereby mounting the chip 20. Then, the electrode portions 16 of the sub-mount 14 and the electrode portions 12 of the substrate are bonded to each other by wire bonding so that an electrode voltage can be applied to the chip.

According to this method, it is necessary to use an additional process of mounting the sub-mount 14 to the ceramic substrate. Due to the structural features for mounting the sub-mount (the use of an epoxy adhesive agent 15), there is posed a problem in that it is impossible to efficiently transfer the heat generated in the ultraviolet chip to a metal substrate. This leads to a problem in that the lifespan of the ultraviolet chip becomes shorter.

In order to solve the aforementioned problems, the present invention provides a metal substrate structure capable of mounting a chip without having to use a sub-mount and a chip package structure capable of preventing exposure of a bonding region generated by the mounting of a chip. Hereinafter, the present invention will be described in detail with reference to the drawings.

Figure 2:
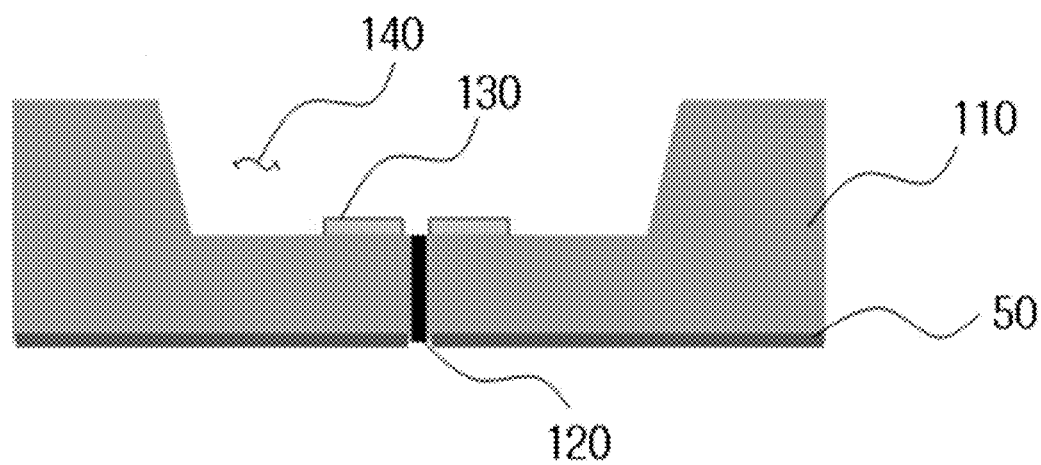
FIG. 2 is a view illustrating a structure of a chip mounting substrate according to one embodiment of the present invention.

FIG. 2 is a view illustrating a structure of a chip mounting substrate according to one embodiment of the present invention.

Referring to FIG. 2, the chip mounting substrate according to the present embodiment includes conductive portions 110, an insulation portion 120 and bumps 130.

In the present embodiment, the conductive portions 110 are used to apply an electrode voltage to a chip 200 mounted. That is to say, the conductive portions 110 are made of an electrically conductive material in order to apply an electrode voltage to the chip 200. The lower portions of the conductive portions 110 are bonded to a base plate 50, in which electrodes are formed, so that the conductive portions 110 can receive an electrode voltage form the outside. In the present embodiment, the conductive portions 110 may be formed of aluminum plates.

The insulation portion 120 electrically isolates the conductive portions 110 so that an electrode voltage can be applied to electrode portions 210 of the chip 200. Specifically, the insulation portion 120 electrically isolates the conductive portions 110 so that a positive voltage and a negative voltage can be applied to the chip 200. The conductive portions 110 thus isolated receive a positive voltage and a negative voltage from the outside.

Furthermore, in the present embodiment, a cavity 140 depressed inward of the conductive portions 110 is formed in the chip mounting substrate to provide a space in which the chip 200 is mounted. Referring to FIG. 2, the surface of the chip mounting substrate on which the chip 200 is mounted is recessed from the outer portion of the chip mounting substrate. That is to say, the chip mounting substrate is shaped such that an outer wall is formed around the region in which the chip 200 is mounted. In order to reflect the light emitted from the chip 200, the cavity 140 may be formed in a wide-top narrow-bottom shape. In other words, as illustrated in FIG. 2, the outer wall may be inclined upward and outward with respect to the center axis of the chip mounting substrate.

In the present embodiment, the bumps 130 are formed at a predetermined height on the surfaces of the conductive portions 110 isolated by the insulation portion 120 and are connected to the electrode portions 210 formed in the chip 200. Specifically, the bumps 130 are formed on the surfaces of the conductive portions 110, namely on the regions of the surfaces of the conductive portions 110 corresponding to the central portion of the cavity 140 as illustrated in FIG. 2.

The regions of the surfaces of the conductive portions 110 corresponding to the central portion of the cavity 140 are isolated by the insulation portion 120. The bumps 130 are formed at a predetermined height on the surfaces of the conductive portions 110 isolated by the insulation portion 120. The bumps 130 are preferably made of an electrically conductive material so that the voltage applied to the conductive portions 110 can be delivered to the electrode portions 210 of the chip 200 via the bumps 130. The bumps 130 may be gold bumps made of gold.

The electrode portions 210 of the chip 200 are formed on one surface thereof facing the surfaces of the conductive portions 110 in which the cavity 140 is formed. The bumps 130 are bonded to the electrode portions 210 formed on one surface of the chip 200.

Figure 3:
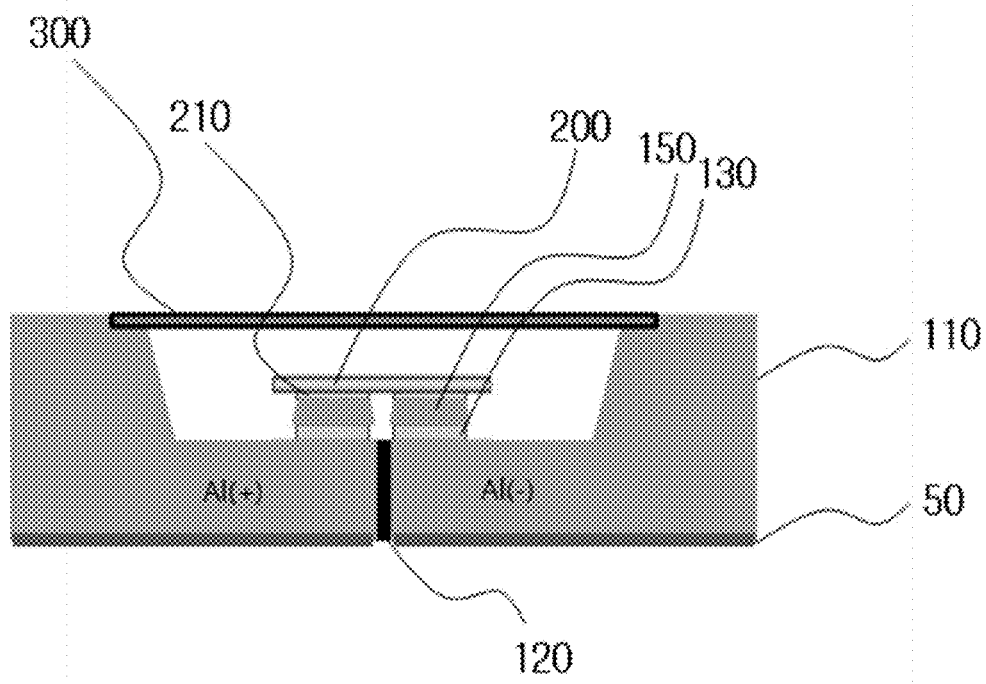
FIGS. 3 to 6 are views illustrating chip packages in which a chip is mounted to the chip mounting substrate according to one embodiment of the present invention.

FIG. 3 is a view illustrating a chip package in which the chip 200 is mounted to the chip mounting substrate according to one embodiment of the present invention. In FIG. 3, the electrode portions 210 of the chip 200 are formed on the lower surface. When the chip 200 is mounted on the chip mounting substrate, the electrode portions 210 of the chip 200 make contact with the bumps 130 formed on the chip mounting substrate.

In the present embodiment, the bumps 130 are formed in the chip mounting locations (electrode regions) on the chip mounting substrate made of aluminum. The bumps 130 may be formed using a wire bonding device. In another embodiment, the bumps may be previously formed in the electrode portions of the chip. Alternatively, the electrode portions of the chip may be formed thick so as to serve as the bumps and may be bonded to the aluminum-made chip mounting substrate.

Referring to FIG. 3, the chip mounting substrate may further include solders 150 formed on the surfaces of the bumps 130 so as to solder the electrode portions 210 and the bumps 130 together. Plating layers 160 formed in the electrode regions of the ultraviolet chip can be bonded to the bumps 130 by a thermo-sonic method. Alternatively, the electrode portions 210 may be soldered to the surfaces of the bumps 130 through the solders 150 formed on the surfaces of the bumps 130.

Figure 6:
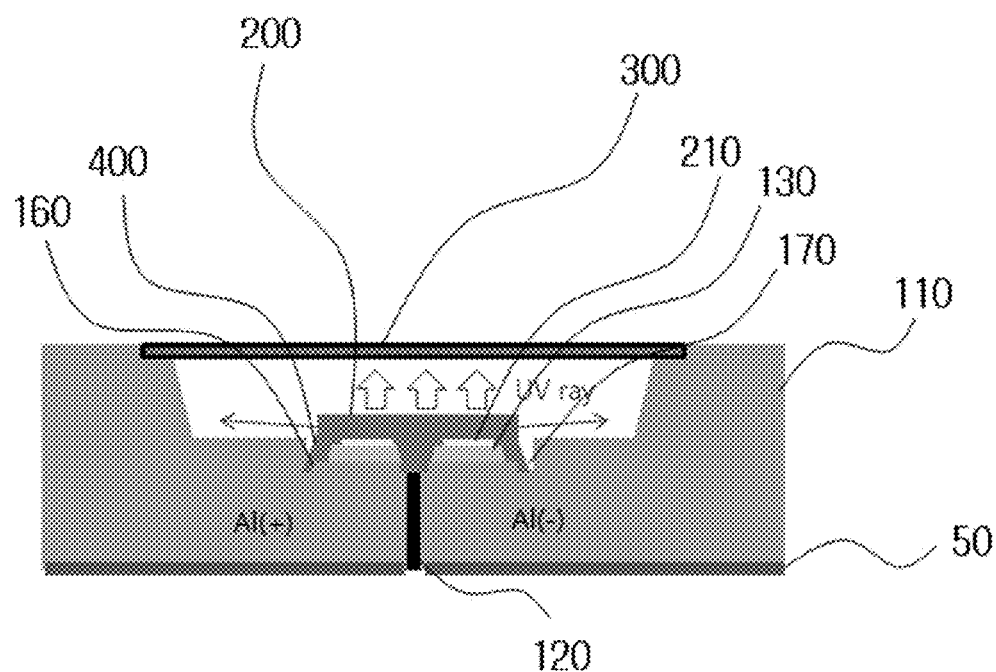

Furthermore, referring to FIG. 6, in the present embodiment, the chip mounting substrate includes a recess formed within the cavity 140 at a predetermined depth. The bumps 130 are formed at a predetermined height on the surfaces of the conductive portions 110 in which the recess is formed. The bumps 130 connector be bonded to the electrode portions 210 formed in the chip 200. As shown in FIG. 6, the recess may be formed to having a predetermined depth in the surfaces of the conductive portions 110 in which the cavity 140 is formed as in FIG. 2, and the bumps 130 may be formed on the bottom surface of the recess.

Due to the structure of the flip chip 200, the ultraviolet rays are outputted from form the surfaces of the chip 200 other than the lower surface thereof. When mounting the chip 200, the bonding regions of the bumps 130 and the electrode portions 210 clearly distinguished from the region from which the ultraviolet rays are emitted. This makes it possible to increase the output of the ultraviolet rays.

In addition, an encapsulation portion 400 to be described later may be further provided. When forming the encapsulation portion 400, it is possible to accurately control the amount of a material. On this point, descriptions will be made later.

Figure 5:
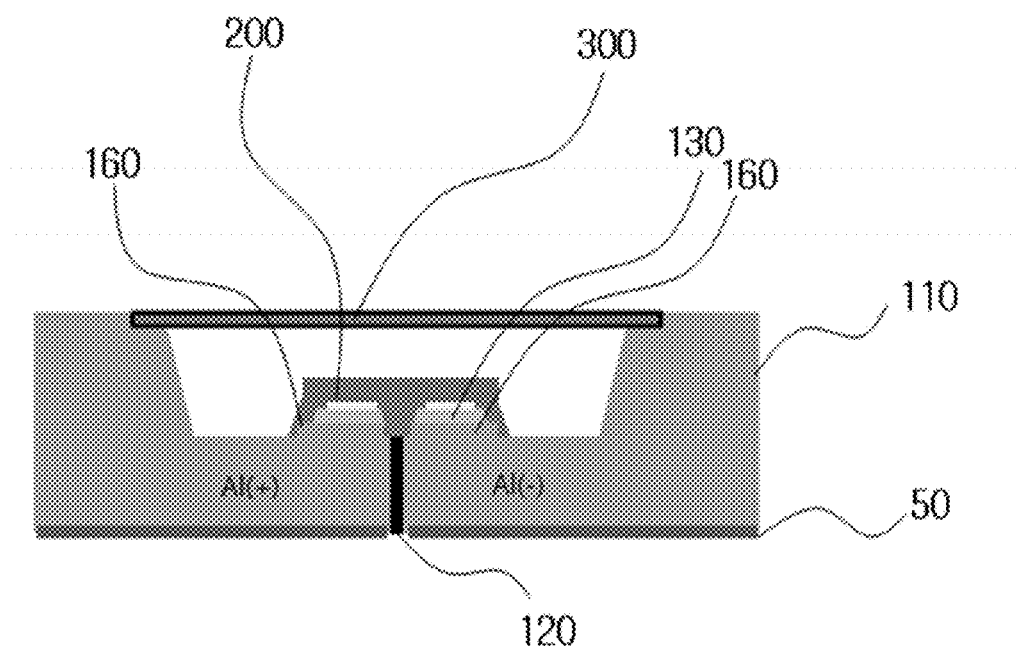

Referring to FIG. 5, the chip mounting substrate may further include plating layers 160 which are formed on the surfaces of the conductive portions 110 between the bumps 130 and conductive portions 110. That is to say, there is a possibility that the reliability is reduced when bonding the bumps 130 on the surfaces of the conductive portions 110. By selectively forming the plating layers 160 on the surfaces of the conductive portions 110, it is possible to strongly bond the bumps 130.

Figure 7:
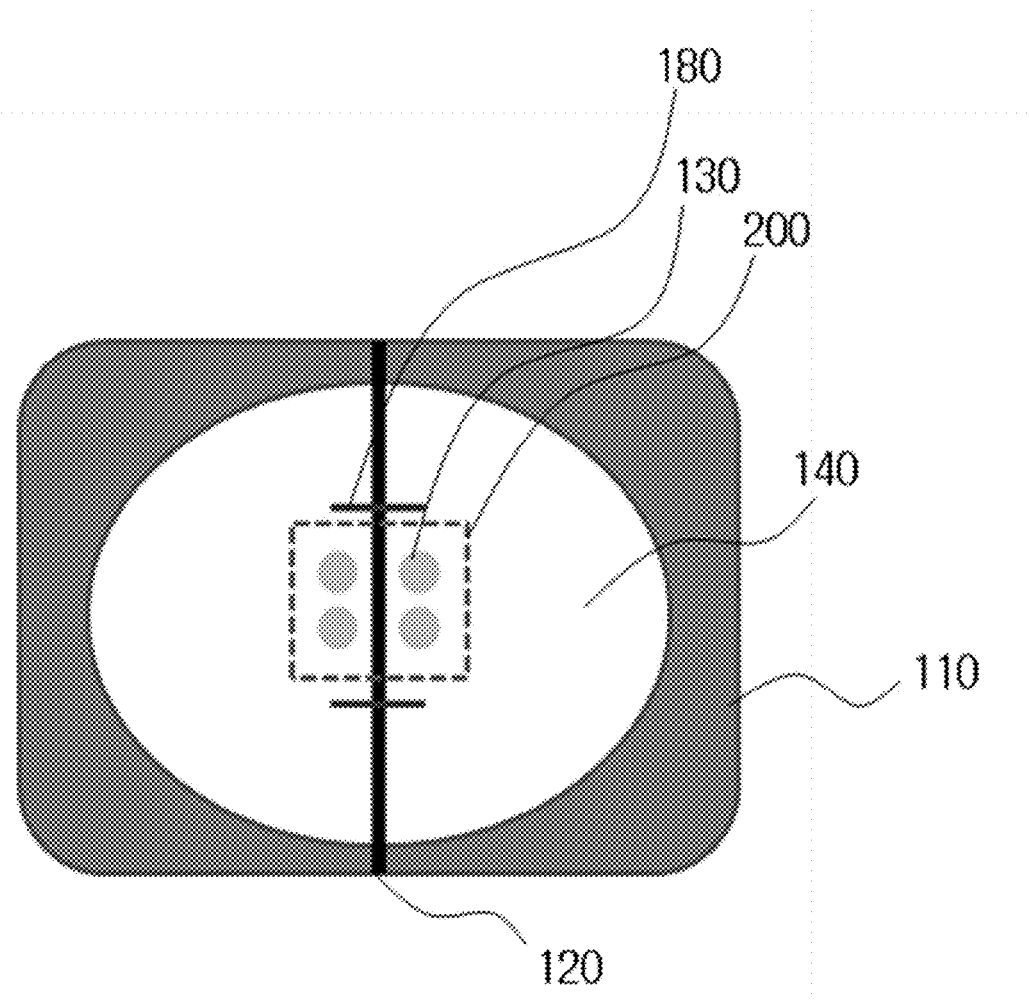
FIG. 7 is a view illustrating a chip mounting substrate further including marking portions according to one embodiment of the present invention.

Referring to FIG. 7, the chip mounting substrate according to the present embodiment may further include marking portions 180 which indicates formation positions of the bumps 130 for bonding the chip 200 and which can be recognized by a device for forming the bumps 130. In the present embodiment, the marking portions 180 are formed to extend across the insulation portion 120. Thus, the device for forming the bumps 130 can recognize the formation positions of the bumps 130 on the bases of the insulation portion 120 and the marking portions 180 and can form the bumps 130 in predetermined positions.

In the present embodiment, the marking portions 180 can be formed by many different methods. The marking portions 180 may be formed by a laser. Use of the laser makes it possible to easily form the marking portions 180 on the chip mounting substrate having a complex shape illustrated in FIGS. 2 and 6. Since the marking portions 180 are formed on the basis of the insulation portion 120, it is preferred that the marking portions 180 is formed in association with the insulation portion 120.

Next, descriptions will be made on a chip package in which the chip 200 is mounted on the chip mounting substrate described above. Referring to FIG. 3, the chip package according to the present embodiment includes a chip 200, a chip mounting substrate and a sealing member 300.

As described above, in the present embodiment, the chip 200 may be an ultraviolet chip. The chip 200 may have a shape of a flip chip, on the lower surface of which electrode portions 210 are formed.

As described above, the chip mounting substrate includes a plurality of conductive portions 110 for applying an electrode voltage to a chip 200, at least one insulation portion 120 for electrically isolating the conductive portions 110, and bumps 130 formed at a predetermined height on the surfaces of the conductive portions 110 and bonded to electrode portions 210 of the chip 200. Since the chip mounting substrate of the chip package according to the present embodiment is the same as the aforementioned chip mounting substrate, descriptions thereof will be omitted.

The sealing member 300 is configured to seal the chip 200 mounted within the cavity 140 and may be disposed on the top surfaces of the conductive portions 110 so as to cover the cavity 140. The sealing member 300 may be made of glass, quartz or silicon.

In the present embodiment, the chip package may further include an encapsulation portion 400. The encapsulation portion 400 is formed in a space between the chip 200 and the chip mounting substrate, which is formed by bonding the bumps 130 to the electrode portions 210 of the chip 200. The encapsulation portion 400 is configured to encapsulate the bonding region of the chip 200.

Figure 4:
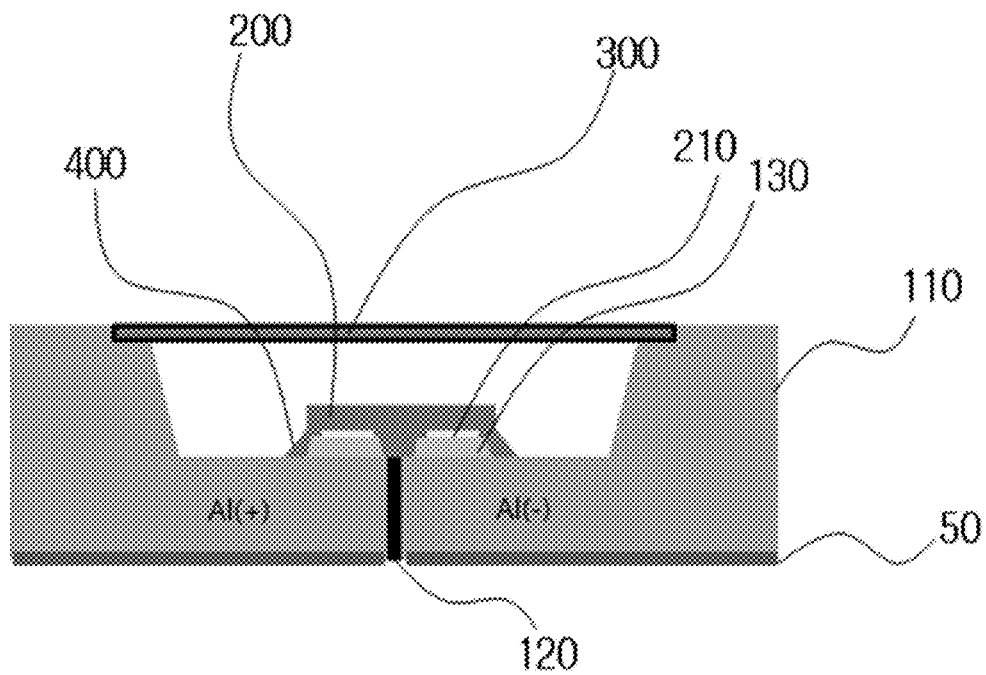

If the encapsulation portion 400 is formed by coating an encapsulation material on the bonding region of the chip 200 as illustrated in FIG. 4, it is possible to prevent generation of a crack which may otherwise be generated due to a difference in thermal expansion coefficient between the chip 200 and the chip mounting substrate. This makes it possible to form a reliable chip package.

Since the bonding region of the chip 200 does not make contact with an air, it is possible to prevent oxidation of the chip 200 which may otherwise be caused by an ambient air. Thus, there is no need to keep the interior of the chip 200 in a vacuum state or to fill an inert gas, for example, a $N_2$ gas, into the chip 200 in order to keep the interior of the chip 200 in an inert state.

In the chip package according to the aforementioned embodiment, in the case of a metal substrate including a vertical insulating layer, the electrode portions of the chip and the electrode portions of the substrate need to be electrically connected to each other. Thud, by additionally forming the bumps on the metal substrate and bonding the bumps to the electrode portions 210 of the chip as in the present embodiment, it is possible to provide reliable bonding between the substrate and the chip. Furthermore, by coating the encapsulation material on the bonding region of the chip, it is possible to prevent generation of a crack which may otherwise be generated due to a difference in thermal expansion coefficient between the materials. It is also possible to prevent oxidation of the bonding region which may otherwise be caused by an ambient air. This makes it possible to perform a packaging process without having to use an additional process of filling an inert gas into a space in which the chip is mounted.

The forgoing descriptions are nothing more than exemplary descriptions of the technical idea of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

The invention claimed is:

1. A chip mounting substrate, comprising:
   a plurality of conductive portions configured to apply an electrode voltage to a mounted chip having electrode portions;
   at least one insulation portion configured to electrically isolate the conductive portions; and
   a plurality of bumps formed at a predetermined height to be bonded to the electrode portions of the chip wherein the chip is mounted on the bumps,
   wherein a cavity depressed inward of the conductive portions and configured to provide a space in which the chip is mounted is formed in the conductive portions, and a recess depressed downward from a bottom surface of the cavity is formed at a central portion of the cavity,
   wherein the electrode portions of the chip are formed on one surface of the chip facing surfaces of the conductive portions having the cavity, and the bumps protrude upward from a bottom surface of the recess, and
   wherein a height of each of the bumps is set such that a side surface of the chip mounted on the bumps is located higher than the bottom surface of the cavity so as to prevent a light emitted from the side surface of the chip from being obstructed.

2. The chip mounting substrate of claim 1, further comprising:
   solders formed on surfaces of the bumps to solder the bumps to the electrode portions of the chip.

3. The chip mounting substrate of claim 1, further comprising:
   marking portions formed on the surfaces of the conductive portions across the insulation portion to indicate positions where the bumps are formed.

4. The chip mounting substrate of claim 1, further comprising:
   plating layers formed at a predetermined height on the surfaces of the conductive portions isolated by the insulation portion and configured to bond the conductive portions to the bumps.

5. A chip package, comprising:
   a chip; and
   a chip mounting substrate including a plurality of conductive portions configured to apply an electrode voltage to the chip having electrode portions, at least one insulation portion configured to electrically isolate the conductive portions, and a plurality of bumps formed at a predetermined height to be bonded to the electrode portions of the chip wherein the chip is mounted on the bumps,
   wherein a cavity depressed inward of the conductive portions and configured to provide a space in which the chip is mounted is formed in the conductive portions, and a recess depressed downward from a bottom surface of the cavity is formed at a central portion of the cavity,
   wherein the electrode portions of the chip are formed on one surface of the chip facing the surfaces of the conductive portions having the cavity, and the bumps protrude upward from a bottom surface of the recess, and
   wherein a height of each of the bumps is set such that a side surface of the chip mounted on the bumps is located higher than the bottom surface of the cavity so as to prevent a light emitted from the side surface of the chip from being obstructed.

6. The chip package of claim 5, further comprising:
   an encapsulation portion formed in a space between the chip and the chip mounting substrate, which is formed by bonding the bumps to the electrode portions of the chip,
   wherein the encapsulation portion is configured to encapsulate a bonding region of the chip.

7. The chip package of claim 5, wherein the chip mounting substrate further includes solders formed on surfaces of the bumps to solder the bumps to the electrode portions of the chip.

8. The chip package of claim 5, wherein the chip mounting substrate further includes marking portions formed on the surfaces of the conductive portions across the insulation portion to indicate positions where the bumps are formed.

9. The chip package of claim 5, wherein the chip mounting substrate further includes plating layers formed at a predetermined height on the surfaces of the conductive portions isolated by the insulation portion and configured to bond the conductive portions to the bumps.

10. The chip package of claim 5, further comprising:
    a sealing member configured to seal the chip mounted within the cavity.

* * * * *